(12) United States Patent
Trehan et al.

(10) Patent No.: US 6,225,554 B1
(45) Date of Patent: *May 1, 2001

(54) EMI SHIELDED ENCLOSURE

(75) Inventors: Anil K. Trehan, Whippany, NJ (US); Charles John Mann; Robert Edwin Slothower, both of Omaha, NE (US)

(73) Assignee: Avaya Technology Corp., Basking Ridge, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/989,114

(22) Filed: Dec. 11, 1997

(51) Int. Cl.⁷ ..................................................... H05K 9/00
(52) U.S. Cl. .................. 174/35 MS; 174/35 R; 361/816; 361/818; 361/796; 361/690
(58) Field of Search ............................. 174/35 R, 35 MS; 361/818, 816, 796, 690

(56) References Cited

U.S. PATENT DOCUMENTS

| | | | |
|---|---|---|---|
| 5,548,085 | * | 8/1996 | Flores .................................. 174/35 R |
| 5,583,750 | * | 12/1996 | Nakata et al. ........................ 361/816 |
| 5,781,410 | * | 7/1998 | Keown et al. ........................ 361/690 |

* cited by examiner

Primary Examiner—William A. Cuchlinski, Jr.
Assistant Examiner—Ronnie Mancho
(74) Attorney, Agent, or Firm—Claude Narcisse; Michael Y. Epstein

(57) ABSTRACT

A modularly designed EMI shielded enclosure made from two end sections coupled to each other by crossing members. Panels and/or doors which are attached to the end sections and crossing members form seams at the points of attachment where said seams are made from overlapping surfaces which substantially reduce the amount of electromagnetic radiation leaking from the enclosure.

4 Claims, 18 Drawing Sheets

EMI SHIELDED ENCLOSURE

BACKGROUND OF THE INVENTION

1. Field of the Invention

The present invention relates to an Electromagnetic Interference (EMI) shielded enclosure and more particularly to an enclosure that provides significantly improved shielding of electromagnetic energy radiated from within the enclosure and substantially prevents the penetration therein of externally radiated electromagnetic energy.

2. Description of the Related Art

Enclosures are often used to house electrical and electronic systems including telecommunications equipment. Such enclosures are typically located either in a central office location or as a remote terminal exposed to the outside environment. The operation of the electronic systems housed in the enclosures often results in the radiation of electromagnetic energy. Many times the electromagnetic energy radiated by the enclosed circuitry can leak through an enclosure that does not provide sufficient shielding of such energy. Thus, these enclosures often become sources of undesired electromagnetic radiation that interfere adversely with other radiated signals (e.g., radio and television signals) and can also interfere with the proper operation of other electrical equipment within and without the enclosures; this is commonly referred to as Electromagnetic Interference (EMI).

It is well known that metallic enclosures provide some shielding from EMI. The electrically conductive surface of metallic enclosures serves to contain some of the radiated EMI within the enclosures. An ideal enclosure for containing electromagnetic radiation would have a continuously closed conductive envelope with no seams, apertures, openings, or gaps. Seams; aperture, openings, gaps and other discontinuities on the surface of these enclosures represent sources of EMI leakage and also tend to reduce the conductivity of the surfaces thus reducing the shielding capability of such enclosures. For example, the particular structural design of such enclosures often require the use of a door, cable-through holes, holes for connectors, ventilation openings and seams resulting from joined metallic surfaces.

Many EMI shielded enclosures are constructed with metallic surfaces or panels welded to each other and to metallic frames. The metallic frames are often constructed with interconnected structural members. The construction and manufacturing of EMI shielded enclosures constructed from structural frames and metallic panels welded to each other is often an expensive process. Moreover, EMI shielded enclosures made from structural frames and panels welded each other are inconsistent with a modular design approach in which the same or similar parts are used to construct enclosures of various sizes.

Further, there exists seam at the point where metallic panels are joined. It is well known that radiated electromagnetic energy can leak through the seams created by the joining of metallic surfaces. The metallic surfaces can be welded to each other, which depending on the length of the weld, may or may not seal the seams. Furthermore, as was stated previously, welding significantly adds to the cost of manufacturing EMI shielded enclosures.

Therefore, there is a need for a modularly designed EMI shielded enclosure that provides a substantially continuous conducting inner surface with properly sealed seams for an improved EMI shielding capability.

SUMMARY OF THE INVENTION

The present invention provides an EMI shielded enclosure comprising a first end section coupled to a second end section with crossing members. The EMI enclosure further comprises side front and rear panels attached to the end sections and the crossing members to form an enclosure with significantly improved EMI shielding. The attachment of the panels to the crossing members and the end sections form seams that substantially prevent radiated electromagnetic energy inside the enclosure from leaking to outside of the enclosure and prevent radiated electromagnetic energy outside of the enclosure from penetrating to the inside of the enclosure.

BRIEF DESCRIPTION OF THE DRAWINGS

It will be appreciated that the drawings described below are shown for illustrative purposes and are not necessarily drawn to scale.

DETAILED DESCRIPTION

Figure 1:
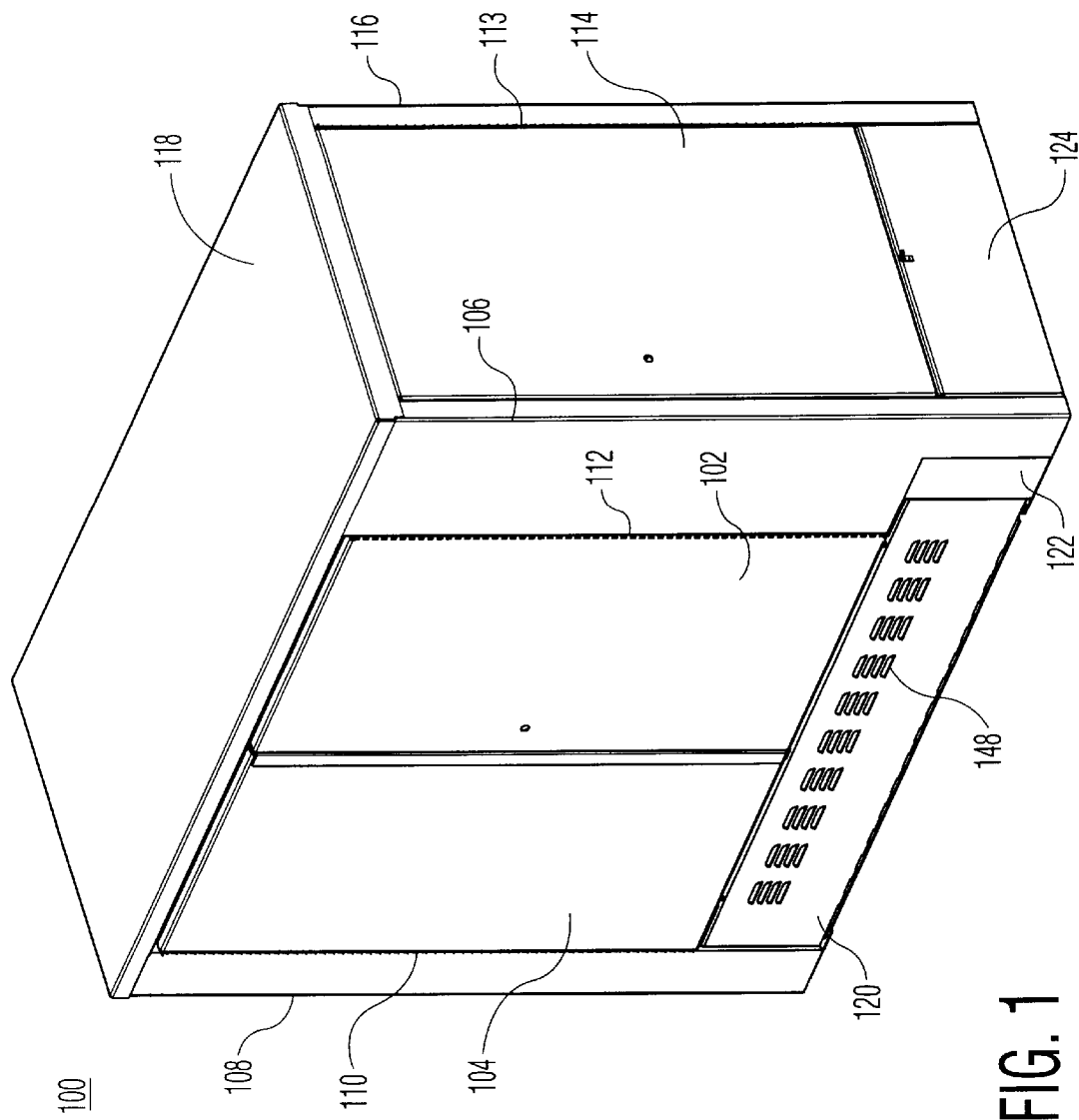
FIG. 1 is a perspective view of the enclosure of the present invention.

FIG. 1 depicts EMI shielded enclosure 100 of the present invention. It will be shown that enclosure 100 is designed and constructed with a first end section coupled to a second end section with crossing members to form a substantially rectangular enclosure that provides significantly improved EMI shielding. The end sections and the crossing members are configured so as to have properly sealed seams. The properly sealed seams are created from ovelapping metal such that any radiated electromagnetic energy traveling through such seams is substantially attenuated. Preferably, enclosure 100 is made from metallic materials. It will be readily understood by those of ordinary skill in the art to which this invention belongs that enclosure and its various versions described herein can be made from nonmetallic materials such as plastic with metallic coatings added to various appropriate surfaces. The metallic materials are painted with a chromate finish and are processed at the overlapping areas to promote electrical conductivity. The processing of the surfaces at the overlapping areas is commonly referred to as masking in which prior to painting, the overlapping areas are covered with tape (e.g., masking tape) so that after the surfaces are painted the overlapping areas are free of paint.

Figure 2:
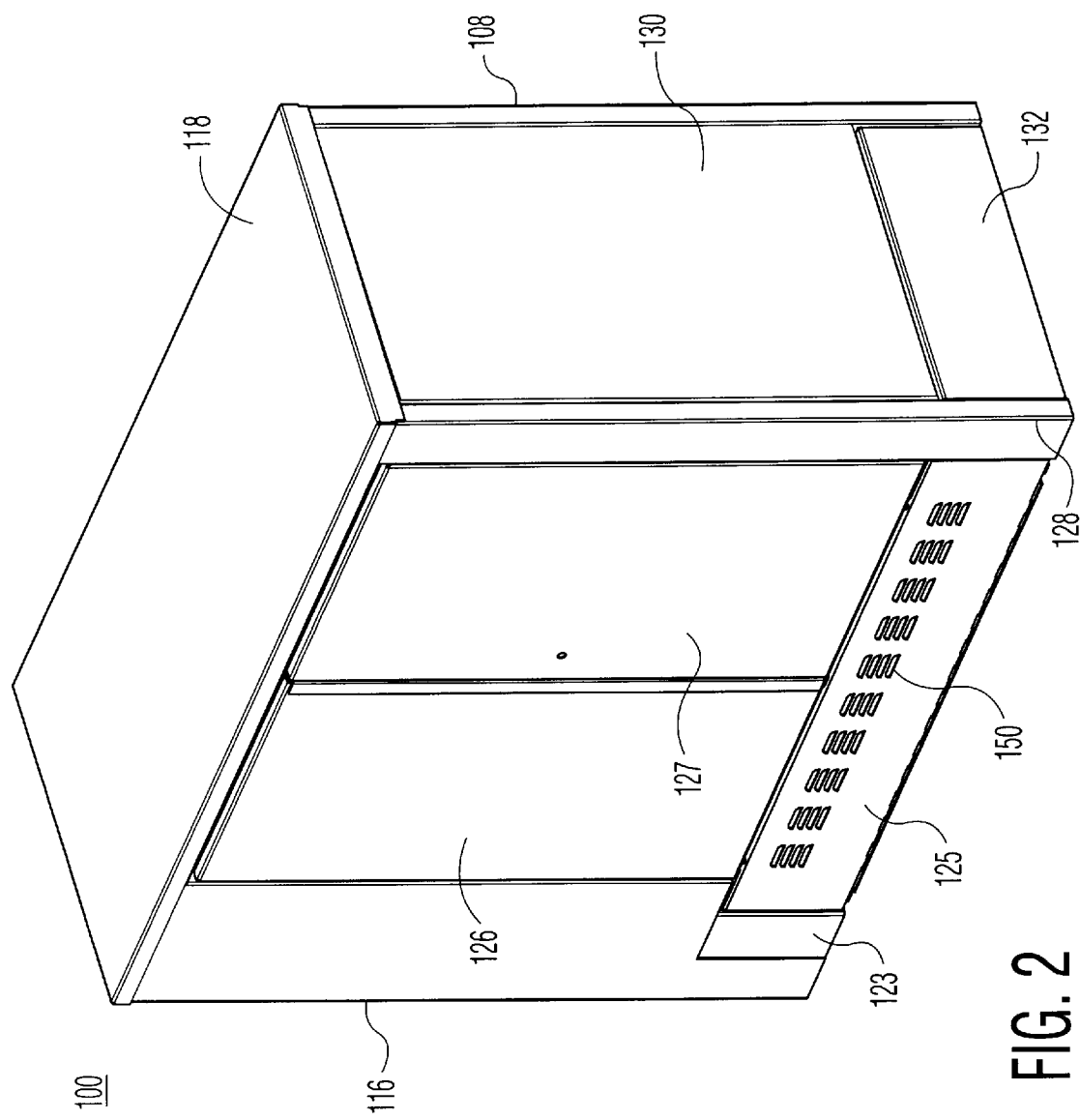
FIG. 2 a perspective rear view of the enclosure of the present invention.

Still referring to FIG. 1, enclosure doors 102 and 104 are attached to legs 108 and 106 respectively via hinges 110 and 112. Side door 114 is attached to leg 116 via hinge 113. Bottom panels 120, 122, 124 are attached to legs 108, 106 and 116. Bottom panel 120 has vents 148. Top panel 118 engages the legs (108, 106, 116) and doors 104, 102 and 114 to form a substantially rectangular enclosure 100 as shown. A rear view of the enclosure of FIG. 1 is shown in FIG. 2 in which rear doors 126 and 127 are attached to leg 116 and leg 128. Still referring to FIG. 2, the enclosure comprises a side panel 130 attached to leg 128 and leg 108. Bottom side panel 132 is also attached to legs 128 and 108. Bottom panel 125, which has vents 150, and bottom panel 123 are attached to legs 128 and 116 respectively.

Figure 3:
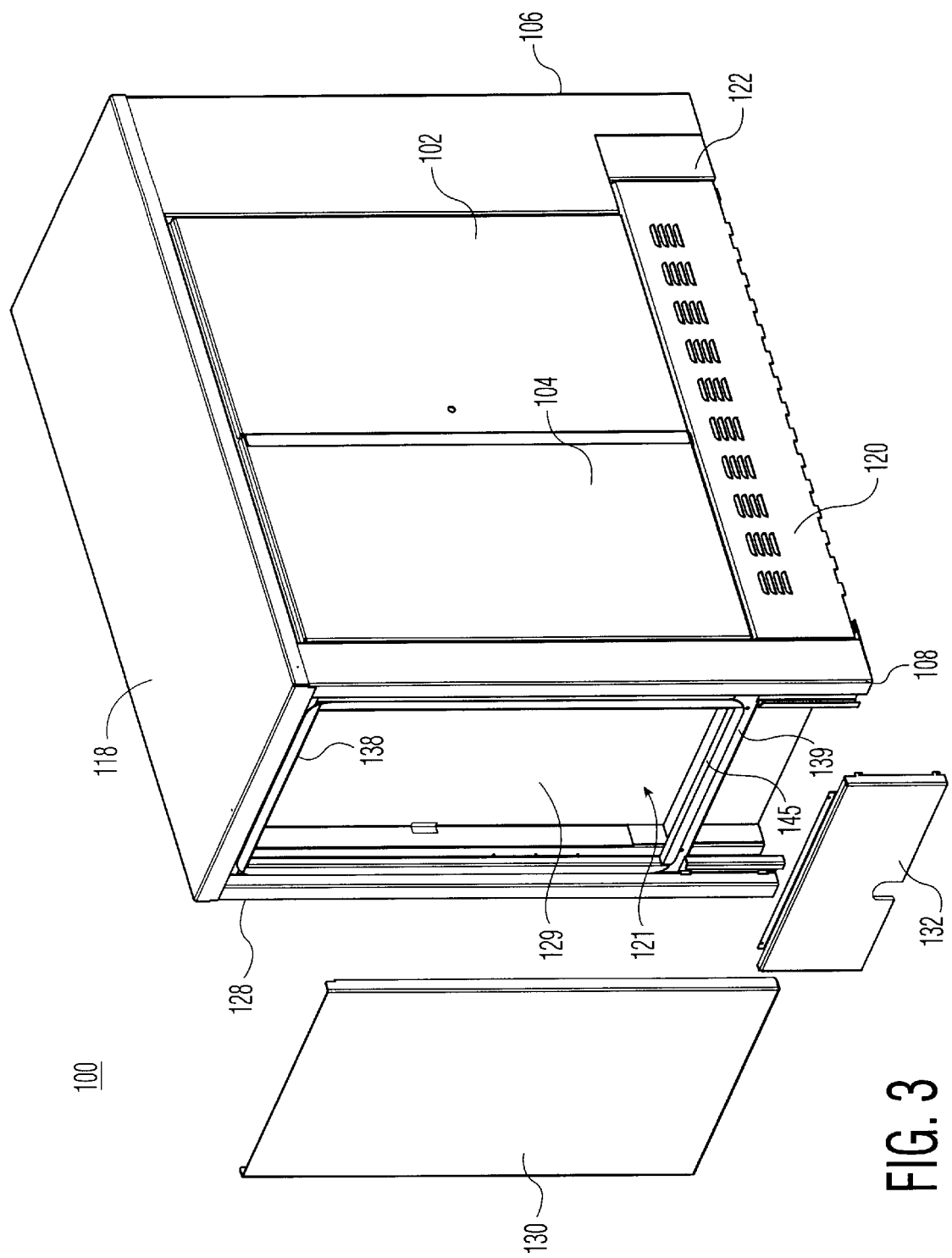
FIG. 3 is a perspective view showing side panel and bottom panel of an end section of the enclosure of the present invention.

FIG. 3 shows an exploded view of how side panel 130 seals opening 121 of a compartment formed by leg 128, leg 108, end top crossing member 138, end bottom crossing member 139, inner side panel 129 and end bottom beam 145. FIG. 3 also shows how bottom panel 132 engages legs 108 and 128.

Figure 4:
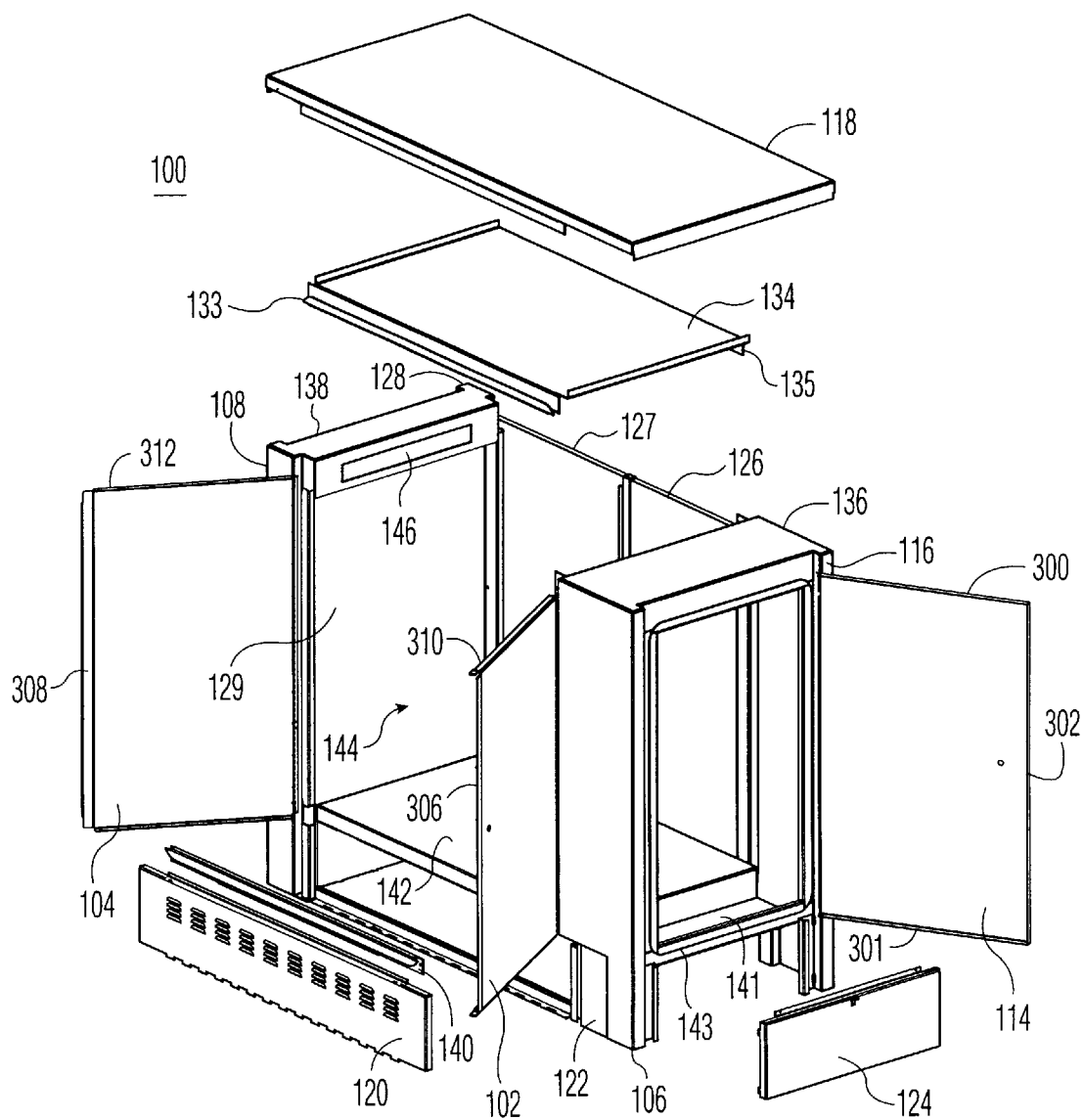
FIG. 4 is an exploded perspective view of the present invention.

FIG. 4 depicts an exploded view of enclosure 100 which as shown comprises a first end section (leg 106, end top crossing member 136, leg 116, end bottom crossing member 143, end bottom beam 141, door 114) coupled to a second end section similar to the first end section (and including, visible in FIG. 4, leg 108, end top crossing member 138, leg 128 and inner side panel 129 and, not visible in FIG. 4 but visible in FIG. 5, end bottom crossing member 139, end bottom member 145 and side panel 130) crossing members (top crossing member 134 and bottom beam 142). Top panel 118 engages both end sections and top crossing member 134 to define, along with bottom beam 142, a space 144. End top crossing member 138 of the second end section has aperture 146 through which cables, wires, connectors and other cabling equipment are routed. Door 114 has top flange 300 and bottom flange 301 and side flange 302. Although not shown in FIG. 4, end top crossing member 136 of the first end section may also contain an aperture for routing cables and wires (not shown).

Figure 5:
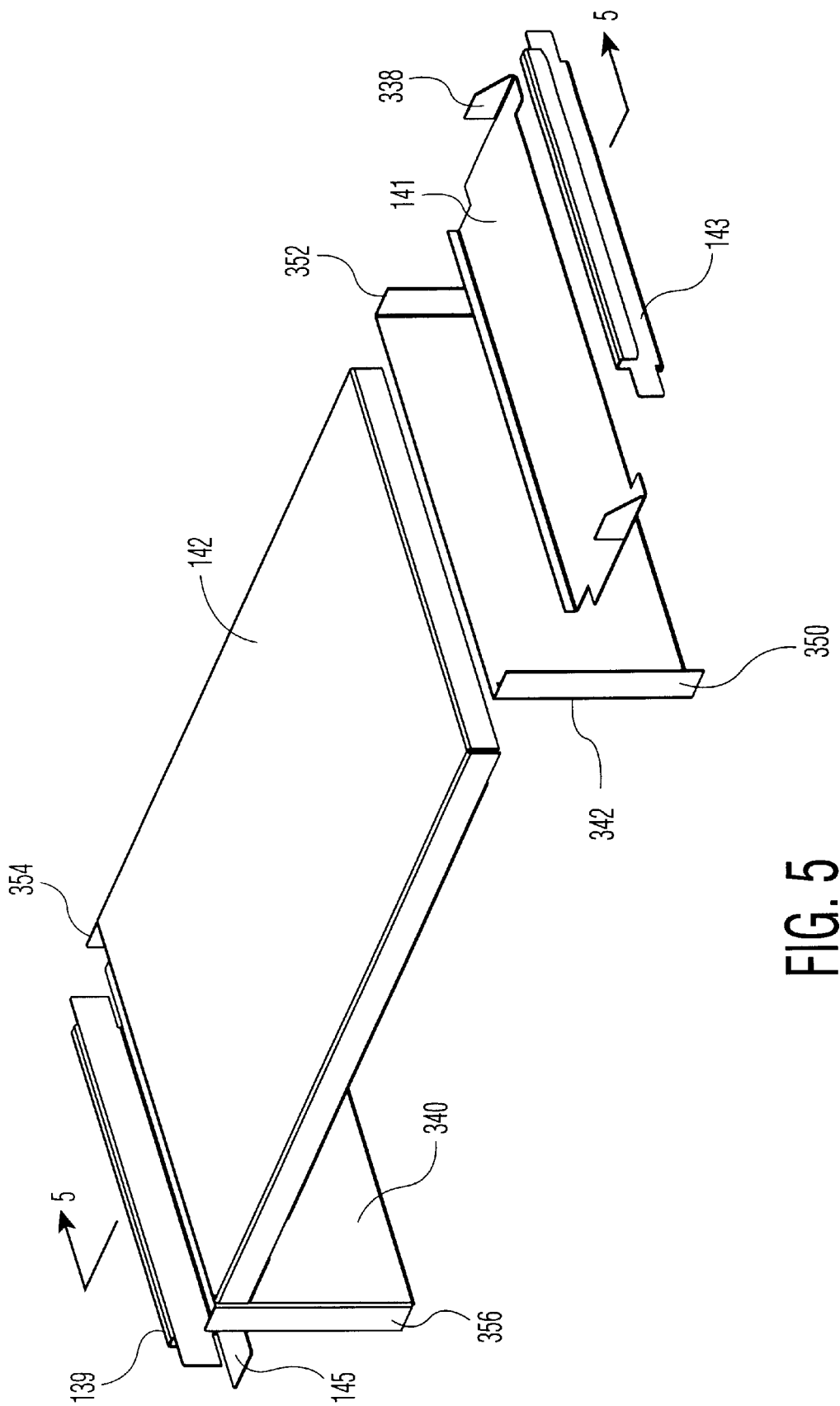
FIG. 5 is an exploded perspective view of the bottom sections of the enclosure of the present invention.

Referring now to FIG. 5, there is shown a perspective view of how bottom beam 142 is attached to end bottom beams 141 (see FIG. 4) and 145 (see FIG. 3). Inner leg 340 has flanges 354 and 356 which engage legs 128 and 108 (not shown) respectively. Although not shown, it will be readily understood that flange 354 forms a seam with leg 128 where such seam has a length equal to at least 1.0 inch. Also flange 356 forms a seam (not shown) with leg 108 where such seam has a length equal to at least 1.0 inch. Similarly inner leg 342 has flanges 350 and 352 which engage legs 106 and 116 respectively. Flange 350 forms a seam (not shown) with leg 106 where such seam has a length equal to at least 1.0 inch. Flange 352 forms a seam (not shown) with leg 116 where such seam has a length equal to at least 1.0 inch. Flange 338 of end bottom beam 141 also form a seam (not shown) with leg 116 where such seam is at least 1.0 inch long. Inner legs 340 and 342 may have foot flanges (not shown) for coupling the legs to a floor panel (not shown).

Figure 5A:
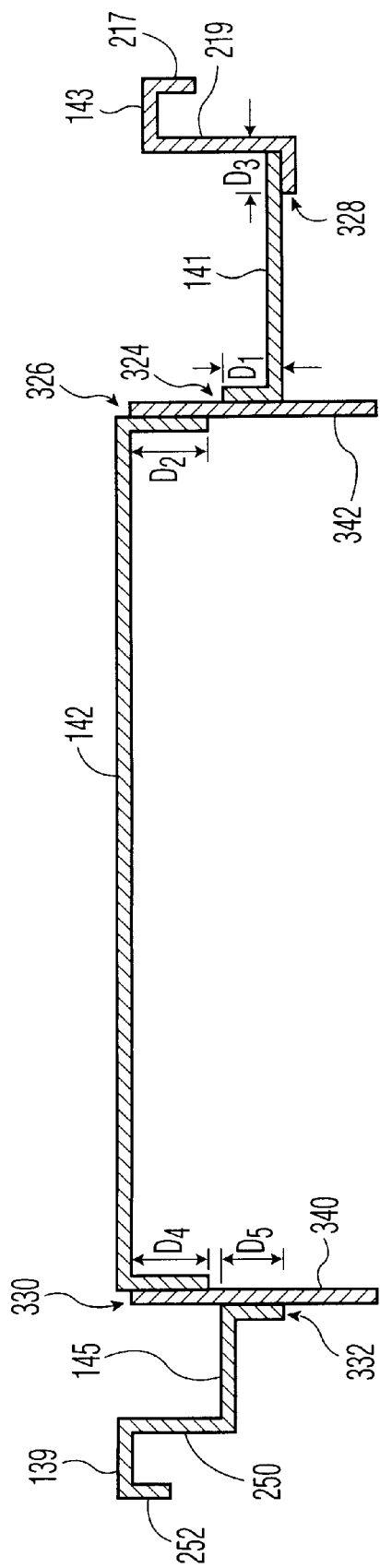
FIG. 5A is a sectional view along lines 5—5 of FIG. 5.

FIG. 5A shows a sectional view of FIG. 5 along lines 5—5 from which it will be readily understood that various seams (324, 326, 328, 330 and 332) are formed from the attachment of bottom beam 142 to end bottom beam 145, end bottom crossing member 139, inner legs 340 and 342, end bottom beam 141 and end bottom crossing member 143. End bottom beam 145 has flange 250 which extends to form end bottom crossing member 139 and gasket flange 252. End bottom beam 141 has flange 219 which extends to form end bottom crossing member 143 and gasket flange 217. The seams 324, 326, 328, 330 and 332 have seam lengths $D_1$, $D_2$, $D_3$, $D_4$, $D_5$ each of which is at least 1.0 inch in length. Thus, as with all other seams formed from overlapping metallic surfaces disclosed herein, radiated electromagnetic energy attempting to leak through the seams (324, 326, 328, 330 and 332) is substantially attenuated after having traveled through the seams.

Figure 6:
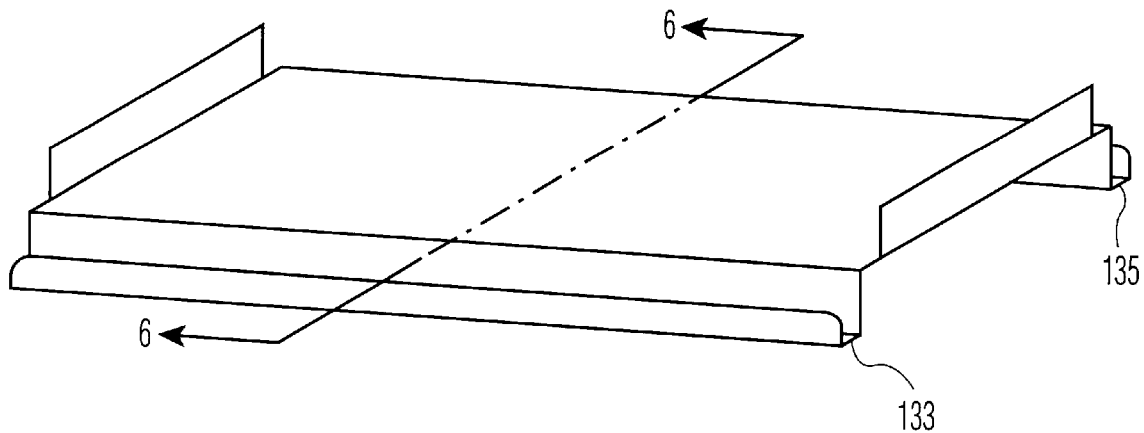
FIG. 6 is a perspective view of a crossing member of the enclosure of the present invention.
Figure 6A:
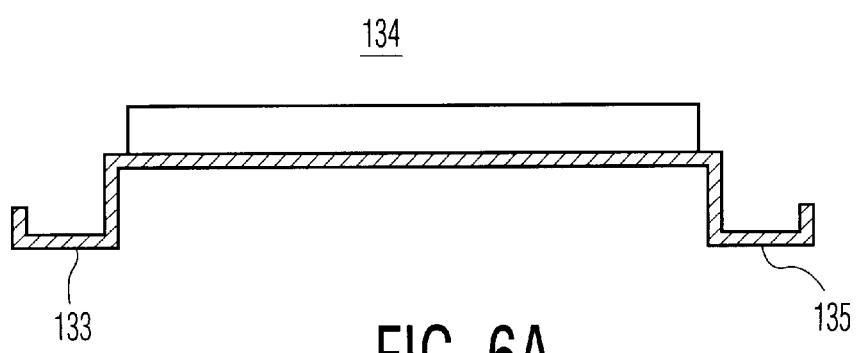
FIG. 6A is a side view of FIG. 6 along lines 6—6.

Referring now to FIG. 6, a perspective view of top crossing member 134 (see FIG. 4) implemented with gasket flanges 133 and 135. FIG. 6A shows a sectional view along cross sectional line 6—6 of FIG. 6 showing the structure of gasket flanges 133 and 135.

Figure 7:
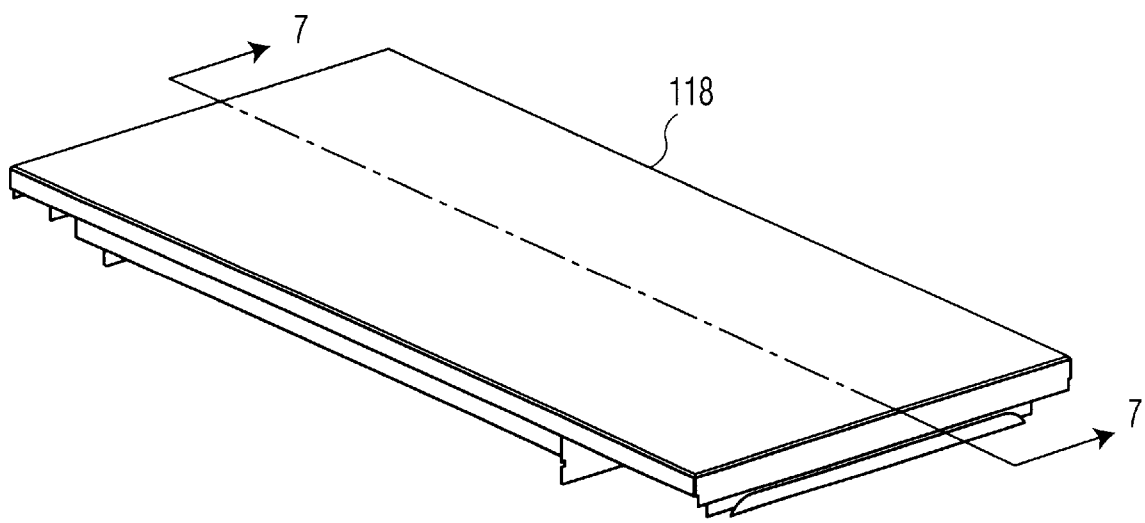
FIG. 7 is a perspective view of the top sections of the enclosure of the present invention
Figure 7A:
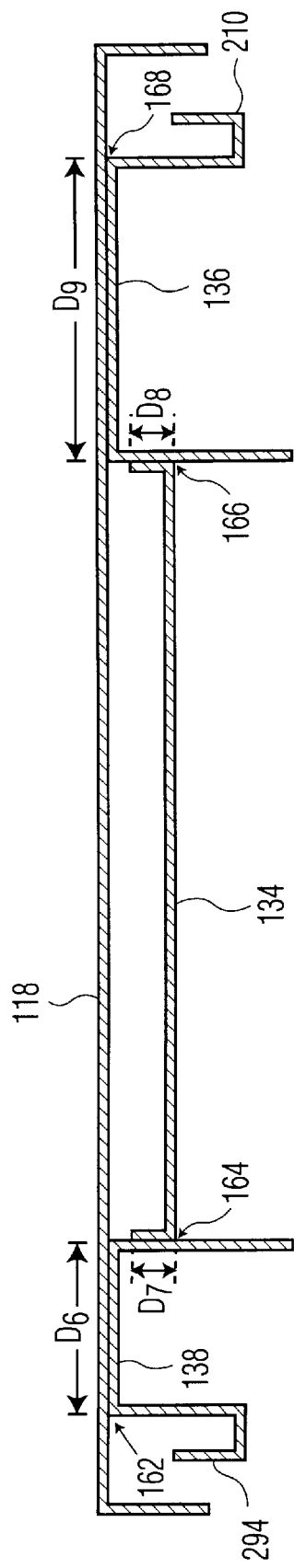
FIG. 7A is a sectional view of FIG. 7 along lines 7—7.

Referring now to FIG. 7, there is shown a perspective view of top panel 118 engaging end top crossing members 138 and 136 (see FIG. 4). FIG. 7A shows a front sectional view along line 7—7 of FIG. 7, where top crossing member 134 is attached to end top crossing members 136 and 138 which engage top panel 118 forming seams 162 and 168. Seam 162 has length $D_6$ and seam 168 has length $D_9$. Each of the seam lengths ($D_6$ and $D_9$) is at least 1.0 inch. End top crossing member 138 also forms seam 164 with top crossing member 134. End top crossing member 136 forms seam 166 with top crossing member 134. Seams 164 and 166 have lengths $D_7$ and $D_8$ respectively each of which is at least 1.0 inch.

Figure 8:
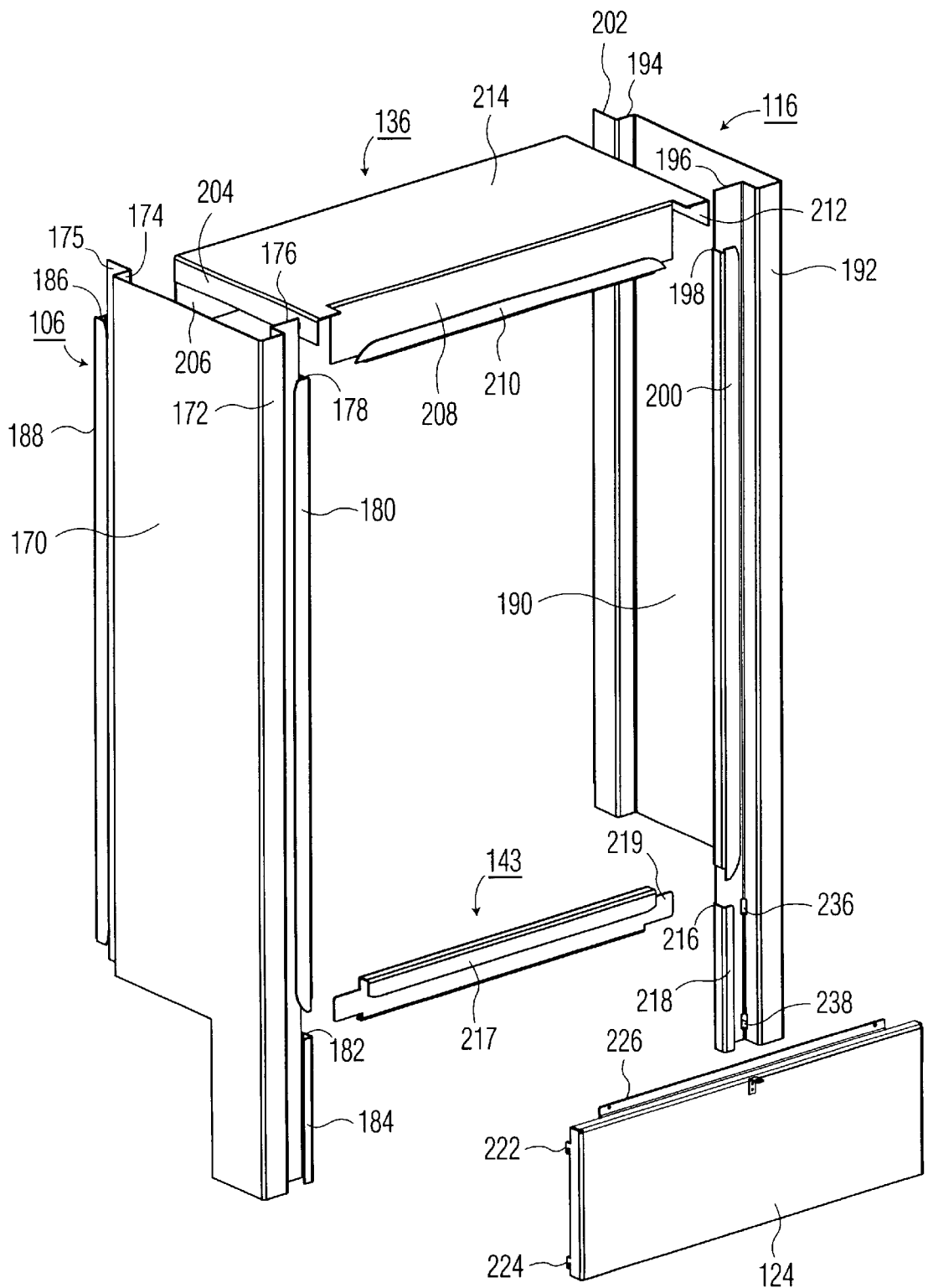
FIG. 8 is an exploded perspective view of the first end section of the present invention.

Referring to FIG. 8, there is shown an exploded perspective view of the first end section. Leg 106 comprises main panel 170 extending at substantially right angles to form sides 172 and 174. Side 172 extends to form L-shaped flange 176 a portion of which is substantially parallel to side 172. L-shaped flange 176 extends via flange extension 178 to form gasket flange 180 which is substantially parallel to side 172. Also, L-shaped flange 176 extends via flange extension 182 to form bottom flange 184 which is also substantially parallel to side 172. Side 174 extends at a substantially right angle to form flange 175 which extends via extension 186 to form flange 188 which is substantially parallel to main panel 170.

Still referring to FIG. 8, leg 116 is substantially identical to leg 106. Leg 116 comprises main panel 190 which extends substantially perpendicularly to form sides 192 and 194. Side 192 extends to form L-shaped flange 196 a portion of which is parallel to side 192. L-shaped flange 196 extends via extension 198 at a substantially right angle to form gasket flange 200. Also, L-shaped flange 196 extends via flange extension 216 to form bottom flange 218 which is also substantially parallel to side 192. Side 194 extends substantially perpendicularly to form flange 202. Flange 202 extends to form a gasket flange 220 (not shown) substantially identical in structure and size to gasket flange 188 of leg 106. End top panel 136 comprises main panel 214 and flanges 204, 206, 208, and 212. Flange 208 extends at a substantially right angle to form gasket flange 210. End top panel 136 is attached to leg 106 via flange 204 and to leg 116 via flange 212. Attachment devices such as bolts and nuts (not shown) or other well known fasteners can be used to attach end top panel 136 to legs 106 and 116. Bottom panel 124 engages end bottom crossing member 143 with flange 226, and hooks 222 and 224 fit into holes (not shown) on leg 106 which are substantially identical to and positioned opposite holes 236 and 238 respectively of leg 106. Another pair of hooks (not shown) similar in size and shape to and positioned opposite hooks 222 and 224 fit into holes 236 and 238 of leg 116. Bottom panel 124 is attached to end bottom crossing member 143 with commonly known attachment devices such as nut and bolts. End bottom crossing member 143 has end bottom beam 141 (not shown; see FIG. 5) flange 219 which extends to gasket flange 217.

Figure 9:
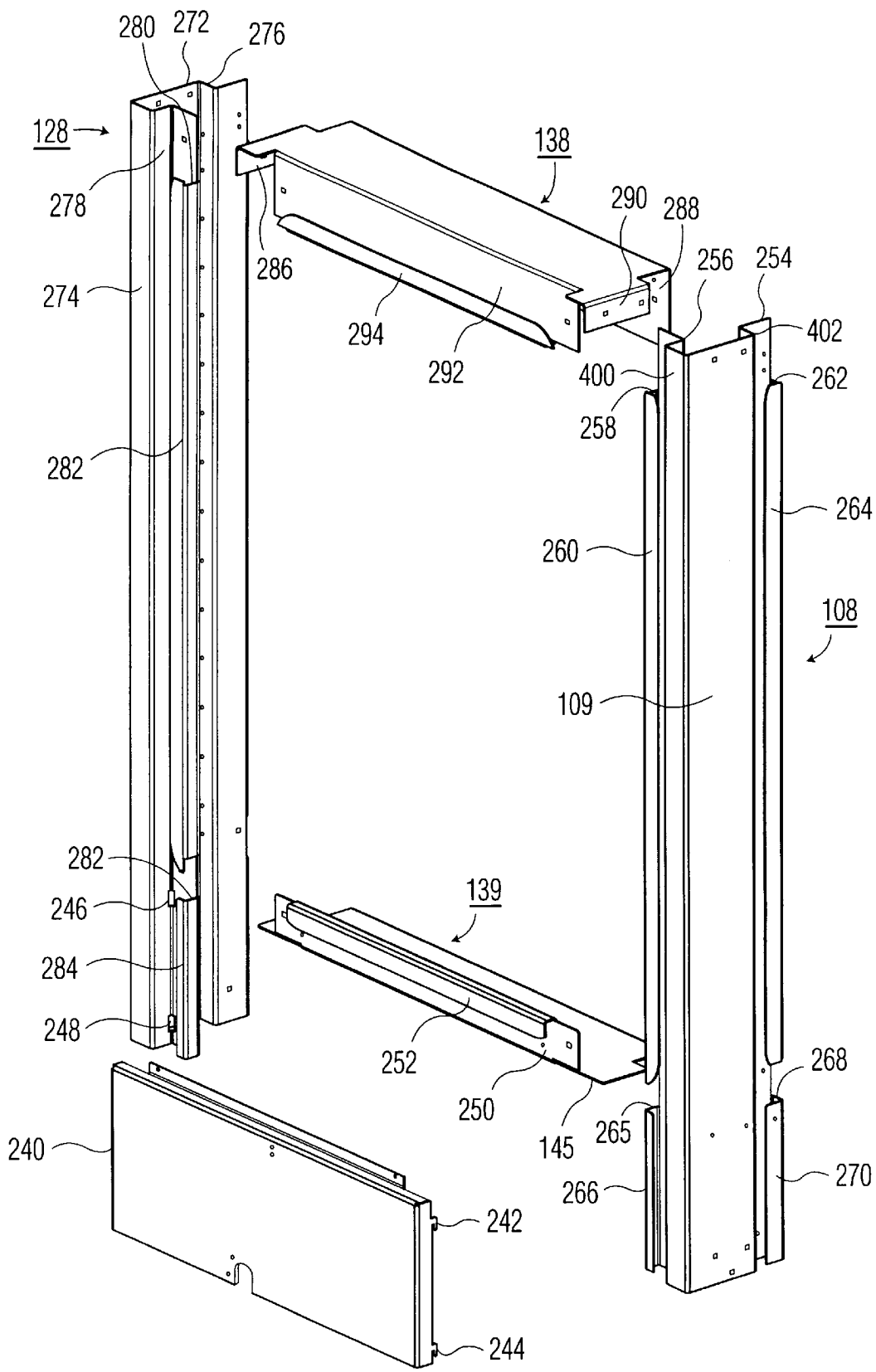
FIG. 9 is an exploded perspective view of the second end section of the present invention.

FIG. 9 depicts the second end section comprising leg 128, end top crossing member 138, leg 108 and end bottom crossing member 139. Leg 108 comprises main panel 109 which extends at substantially right angles to sides 400 and 402. Side 400 extends to form L-shaped flange 256. L-shaped flange 256 extends at a substantially right angle via extension 258 to gasket flange 260 which is substantially parallel to side 400. Further, L-shaped flange 256 extends via extension 265 to form bottom flange 266. Side 402 extends at a substantially right angle to form flange 254. Flange 254 extends via extension 262 to form gasket flange 264. Further flange 254 extends via extension 268 to form bottom flange 270. Bottom panel 240 engages legs 128 and 108 and end bottom crossing member 139.

Still referring to FIG. 9, end bottom crossing member 139 comprises gasket flange 252 extending from flange 250 which extends from end bottom beam 145. Leg 128 comprises main panel 272, side 274 and side 276. Side 274 extends to form L-shaped flange 278, a portion of which is substantially parallel to side 274. L-shaped flange 278 extends via extension 280 to form gasket flange 282 which is substantially parallel to side 274. L-shaped flange 278 also extends via extension 282 to form bottom flange 284 which is substantially parallel to side 274. Side 276 extends via an extension (not shown) to form a gasket flange (not shown) which are substantially identical in size and structure to extension 262 and gasket flange 264 respectively of leg 108. End top crossing member 138 comprises flanges 286, 288, 290 and 292. Flange 292 extends to form gasket flange 294. End top crossing member 138 and end bottom beam 145 may have apertures or openings (not shown) for routing cables and wires. End top crossing member 138 is attached to leg 108 via flange 290 and is attached to leg 128 via flange 286. Bottom panel 240 has hooks 242, 244 that fit into corresponding holes (not shown) of leg 108. Bottom panel 240 also has another pair of hooks (not shown) positioned opposite hooks 242 and 244 respectively and which fit into corresponding holes 246 and 248.

Figure 10:
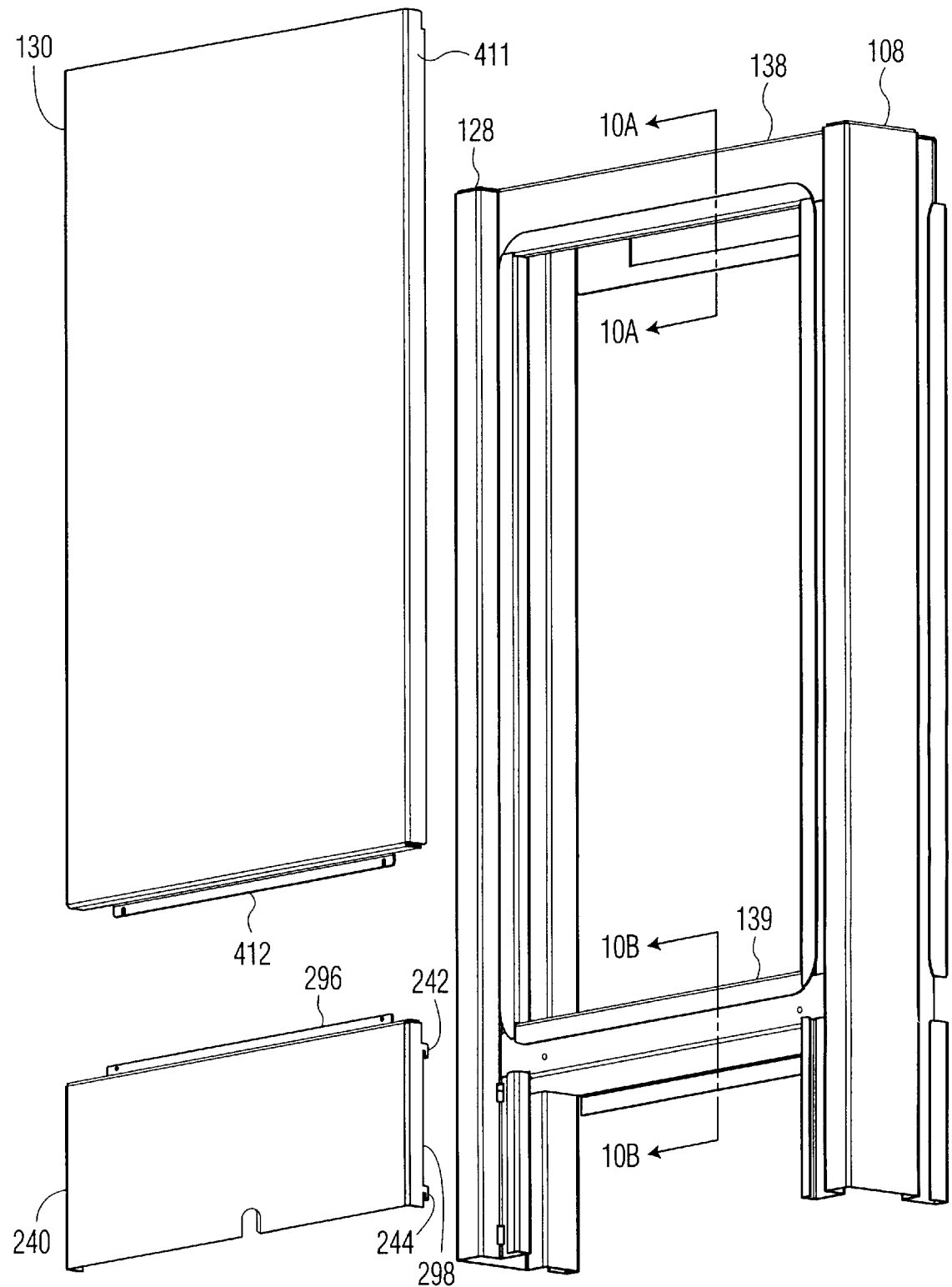
FIG. 10 is a perspective view of the second end section showing the side and bottom panels exploded from the second end section.
Figure 11A:
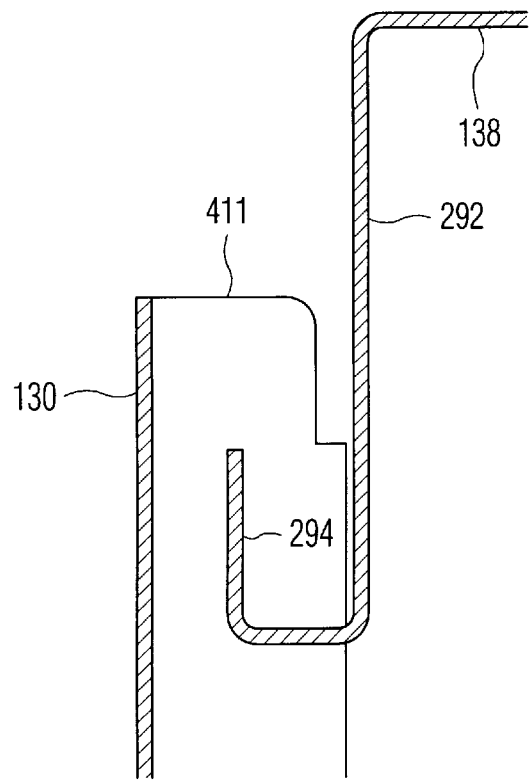
FIG. 11A shows a close up sectional view along lines 10A—10A of FIG. 10.
Figure 11B:
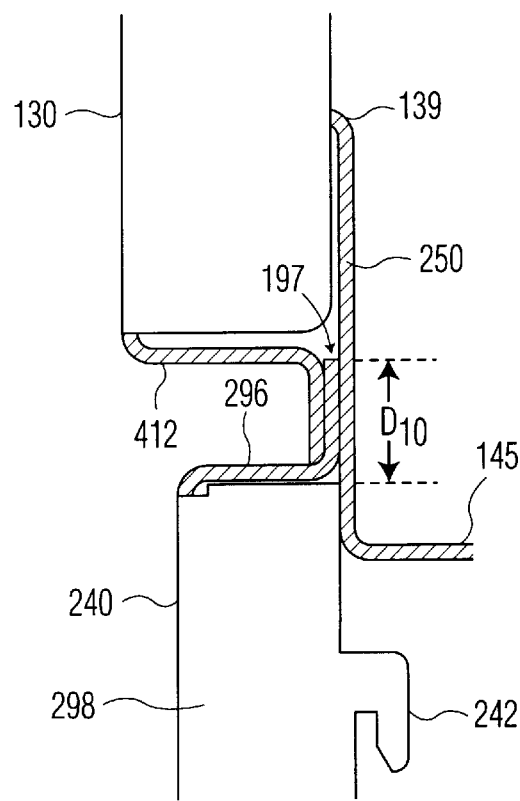
FIG. 11B shows a close up sectional view along lines 10B—10B of FIG. 10.

FIG. 10 shows a perspective view of the second end section with side panel 130 and bottom panel 240 exploded from legs 128, 108 and end crossing members 138 and 139. Side panel 130 has flanges 411, 412 and another flange (not shown; similar to and positioned parallel and opposite of flange 411) that engage the end crossing members (138, 139) and bottom panel 240. FIG. 11A is a close up side view along lines 10A—10A of FIG. 10 showing how flange 411 of side panel 130 engages flange 292 and gasket flange 294 of end top crossing member 138. FIG. 11B shows a close up side view along lines 10B—10B of FIG. 10. Flange 412 of side panel 130, flange 296 of bottom panel 240 and flange 250 of end bottom crossing member 139 overlap to form seam 197 having length $D_{10}$ equal to at least 1.0 inch.

Figure 12:
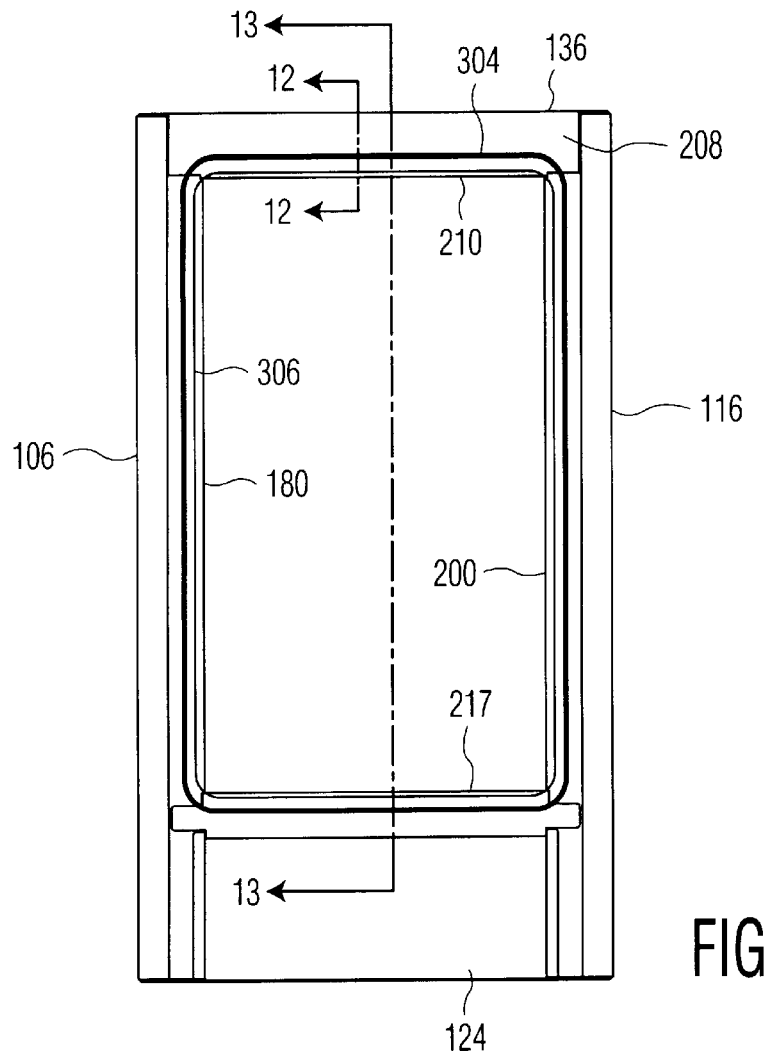
FIG. 12 shows a frontal view of the first end section having environmental and EMI gaskets mounted thereon.

FIG. 12 shows a side view of the first end section (door 114 not shown for clarity purposes) with environmental gasket 304 and EMI gasket 306 mounted to gasket flanges 210, 200, 217 and 180. Environmental gasket 304 is a well known type of gasket commonly described as a clip-on gasket such as G461–G350 gaskets manufactured by Happich Inc. of Wuppertal, Germany. EMI gasket 306 is of the type that can be adhered onto a surface such as Soft Shield™ 01-0904-7357 manufactured by Parker-Chomerics, a division of Parker -Hannafin Corp. of Woburn, Mass. Environmental gasket 304 is designed to seal surfaces to prevent external objects such as sand, insects, and the elements of weather from penetrating enclosure 100. EMI gasket 306 provides the proper seal between surfaces to act as a barrier of radiated electromagnetic radiation. It will be readily understood that EMI gasket 306 can be constructed as a clip-on gasket and environmental gasket 304 can be constructed so that it is adhered onto a surface. It will be further understood that similar gaskets can be mounted onto any and all of the gasket flanges of the present invention.

Figure 12A:
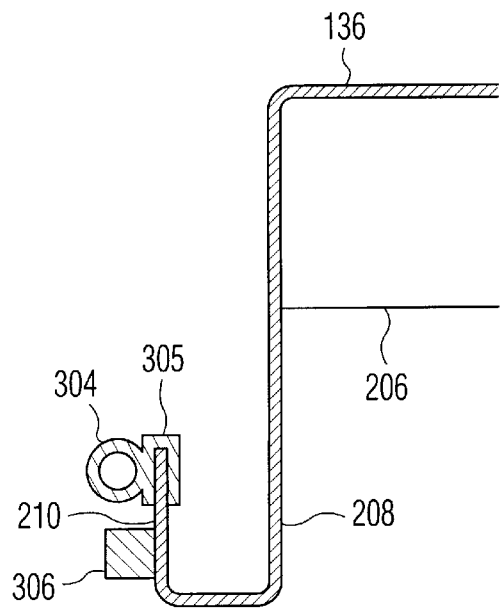
FIG. 12A is a side sectional view along lines 12—12 of FIG. 12.
Figure 12B:
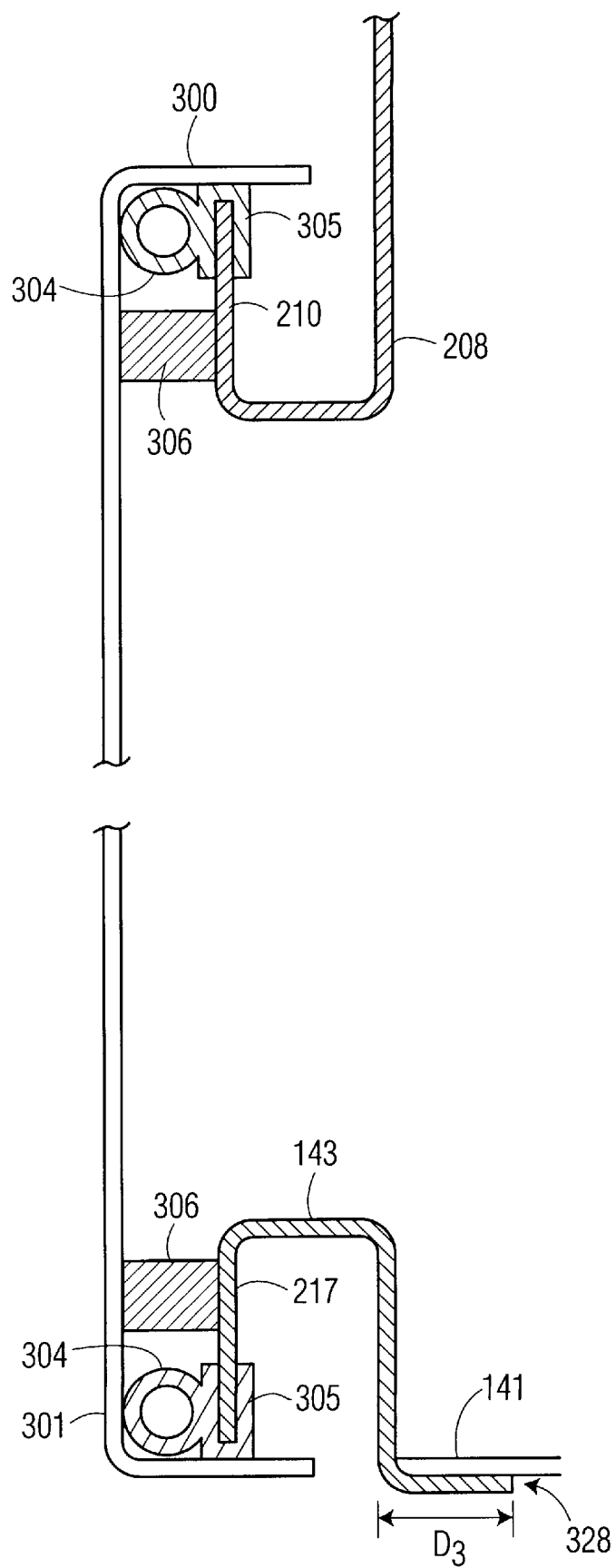
FIG. 12B is a side sectional view along line 13—13 of FIG. 12 with door and gasket flanges added.

FIG. 12A is a close up sectional view along lines 12—12 of FIG. 12. Environmental gasket 304 is mounted onto gasket flange 210 with clip 305. EMI gasket 306 is adhered onto gasket flange 210. When door 114 of the first end section is closed, EMI gasket 306 and environmental gasket 304 provide the proper seal between the gasket flanges (210, 200, 217, 180) and door 114. FIG. 12B shows a side section view when door 114 is closed. Door 114 has top flange 300 and bottom flange 301 both of which wrap around flanges 210 and 217 with the gaskets mounted thereon so as to provide the proper environmental and EMI seal. Although not shown, it will be readily understood that the manner in which door 114 engages the flanges (210, 200, 217, 180) with the gaskets (304, 306) mounted thereon is substantially identical to the manner in which doors 104, 102, 127 and 126 engage their corresponding flanges and gaskets.

Figure 13:
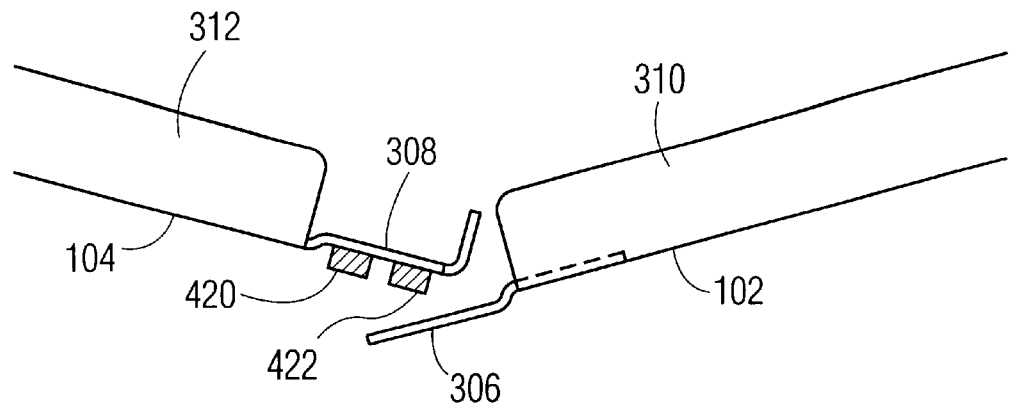
FIG. 13 is a top view of enclosure doors in an open position.
Figure 13A:
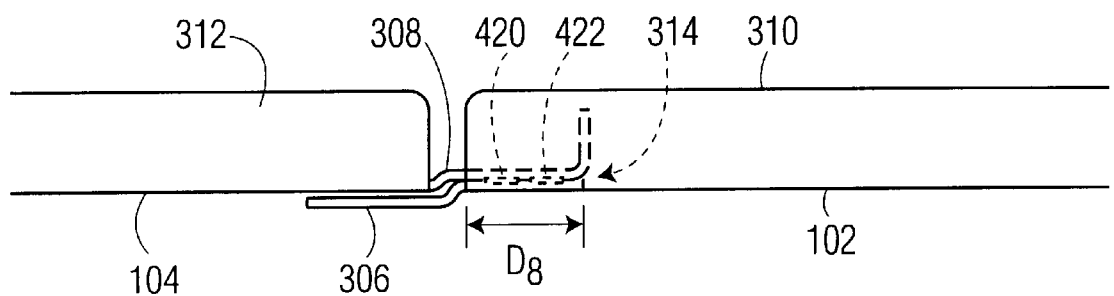
FIG. 13A is a top view of enclosure doors in a closed position.

FIG. 13 shows a top view of doors 104 and 102 in an open position. Doors 104 and 102 have bottom flanges (not shown) substantially identical to top flanges 310 and 312. When doors 104 and 102 are closed as shown in FIG. 13A, seam 314 (of length $D_8$ equal to at least 1.0 inch) is created from flange 306 and flange 308. Doors 104 and 102 are substantially identical in structure and size to doors 126 and 127. Environmental gasket 420 and EMI gasket 422 are mounted longitudinally on flange 308 along the length of door 104 to provide environmental sealing and electromagnetic shielding respectively the It should be noted that the bottom panels (122, 124, 123 and 132), and bottom panels 120 and 125 which have vents 148, 150 (see FIGS. 1 and 2), engage the four legs (106, 116, 108 and 128) to form various compartments which are not part of the present invention.

Figure 14A:
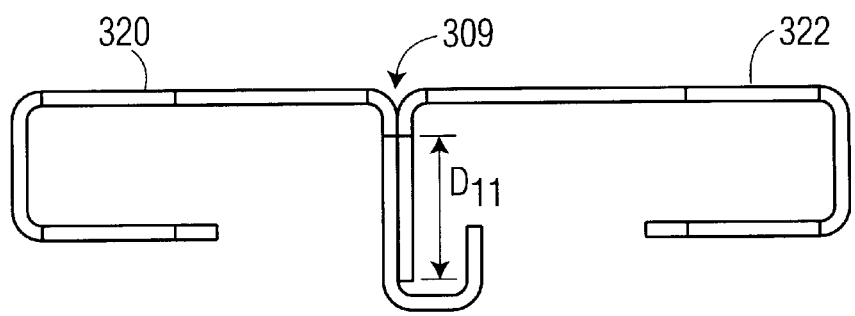
FIG. 14A is a top view of a modular attachment section for the expanded enclosure.
Figure 14:
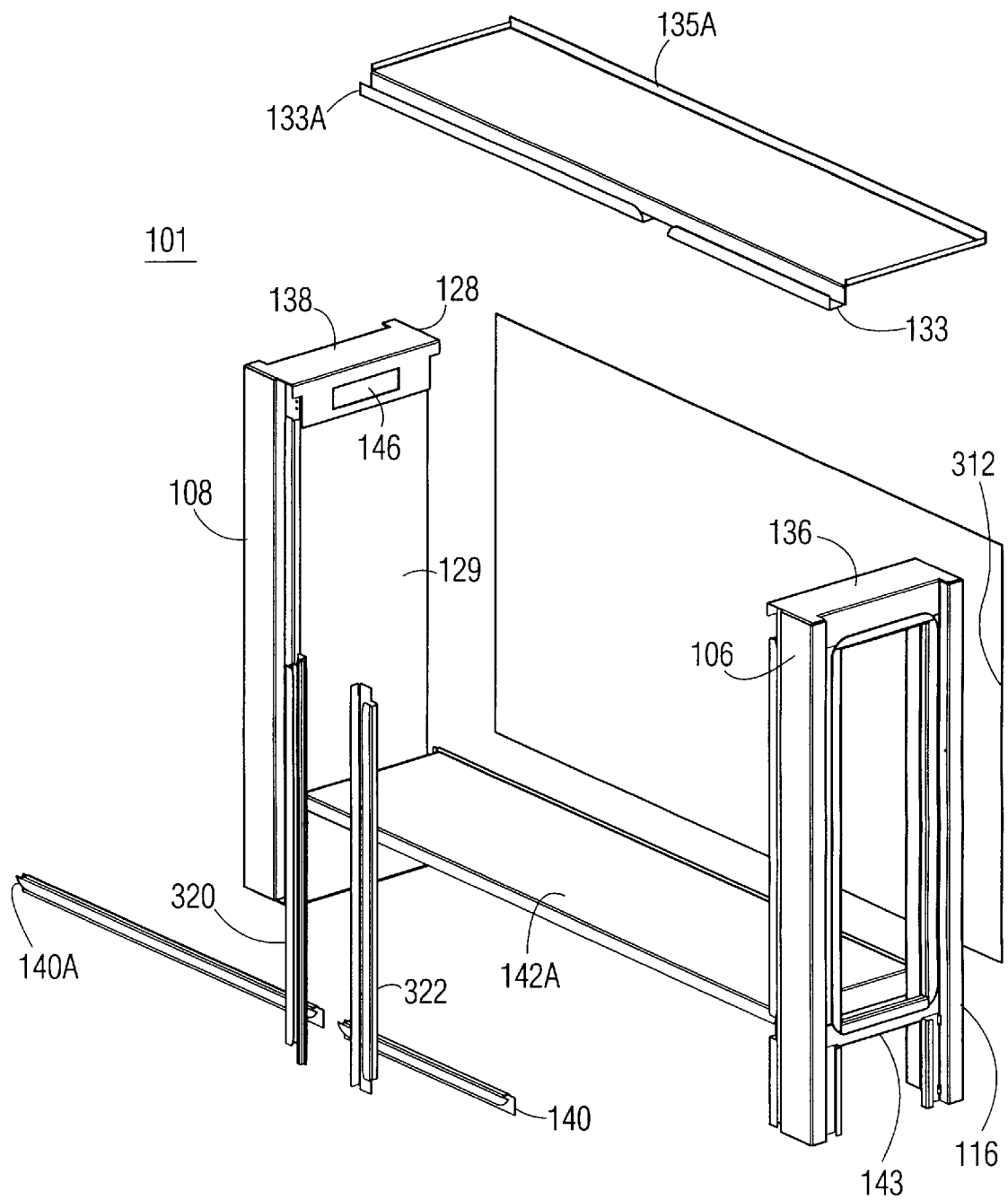
FIG. 14 is a perspective exploded view of an expanded version of the enclosure of the present invention.

The enclosure of the present invention is a result of a modular design approach that allows enclosure 100 to be expanded in size in the manner shown in FIG. 14. Referring to FIG. 14, enclosure 101 is shown in which modular attachment sections 320 and 322 are attached to a top crossing member (shown at the top of the drawing and including flanges 133A and 135A) and crossing members 140 and 140A. A top view of modular attachment sections 320 and 322 is shown in FIG.14A. The modular attachment sections (320, 322) engage each other to form seam 309 with seam depth $D_{10}$ being equal to at least 1.0 inch. It should be noted that the top crossing member is simply an elongated version of crossing member 134 (see FIG.4). Flange 133A is simply an elongated version of flange 133 and is substantially similar in structure to flange 133. Rear panel 312 is used to seal the rear of enclosure 101. It will be understood that a similar rear panel can also be used to seal the rear of enclosure 100 instead of doors 126 and 127 (see FIG. 4). Because of the similarity in shape and structure of the corresponding parts of enclosures 100 and 101, the tooling and assembly costs and thus the manufacturing costs of these enclosures are significantly reduced. Corresponding members (e.g., legs, top and bottom sections ) that make up an expanded enclosure are substantially identical in size and shape to each other simplifying and reducing the cost of manufacture and assembly of such enclosures.

Figure 15:
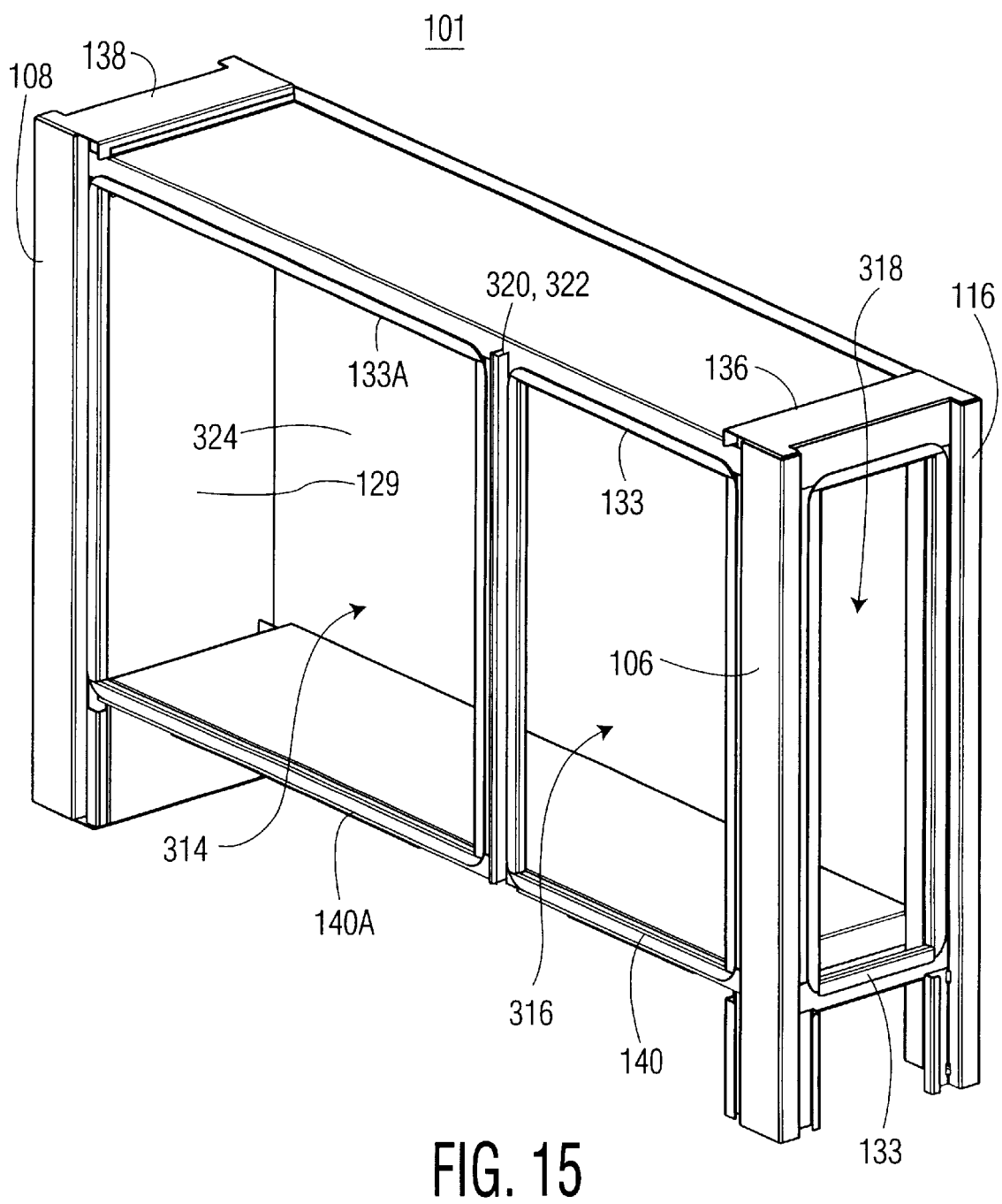
FIG. 15 is a perspective view of an expanded version of the enclosure.

FIG. 15 shows enclosure 101 assembled with rear panel 324, side opening 318 and front openings 314 and 316. Some or all of the openings can be sealed with doors similar in structure to doors 104, 102 and 114 and panel 130 of enclosure 100. The doors and/or panels that may be associated with openings 314, 316 and 318 are not shown for clarity purposes.

In brief, further summary, the enclosures illustrated each comprises two end sections, each comprising a respective pair of legs 106 and 116 and 108 and 128. Each leg serves, in effect, as a corner of the enclosure formed wholly from sheet metal (see, e.g., FIG. 8) integrally formed and without seams. Also, each corner, as an integral portion thereof, includes two vertically extending gasket flanges defining vertical side edges of each of side and end openings into the enclosures. For example, in the end section shown in FIG. 8, the corner (leg) 106 includes the vertically extending gasket flange 180 which defines a vertical edge of the enclosure end opening (FIG. 1) closed by the door 114. The corner 106 also includes the vertically extending (FIG. 8) gasket flange 188 which defines (FIG. 1) a vertical edge of the front opening of the enclosure closed by doors 102 and 104. The integral and seamless sheet metal corners (106, 116 and 108, 128) at each end of the enclosure provide quite rigid but quite inexpensive basic frame members on which all other portions of the enclosure are supported. Compared with the aforedescribed known enclosures constructed with metallic surfaces or panels welded to each other and metallic frame's, the present enclosure is less expensive, as requering very little welding (the corners themselves being integral members without welded seams). As generally known, welding is an expensive manufacturing process, and for this reason, the aforementioned attachment devices, such as bolts and nuts are used.

A welded seam, of course, integrally joins together two metal parts along the seam length and is essentially impervious to EMI radiation. For avoiding EMI leakage, in accordance with this invention, using non-welded seams comprising surfaces clamped together by spaced apart fasteners, two strategies are employed. One is to ensure that the seams between two-mutually transversely extending members comprise flanges bent at right angles to one of the members (e.g., in FIG. 8, the flange 204 bent at a right angle to the panel 214), and with the flanges clamped against corresponding flat surface portions of the other member (e.g., the main panel 170 shown in FIG. 8). Provided the width of the seams, e.g., the width of the flange 204, as measured between the intersection of the flange 204 with the panel 214 and the forward or free end of the flange, is at least one inch, EMI radiation otherwise leaking through tiny gaps in the seams is attenuated owing to the extensive (one inch) length of travel of the radiation between the two facing conductive surfaces of the seams.

The other strategy is to ensure that the clamped together surfaces of the seams are in extremely low electrical resistance contact with one another. While the enclosure frame members are typically of metal, all metal surfaces are first coated with an electrically conductive chromate film covered, in turn, with paint. While the nut and bold type fasteners securing together metal parts will serve to electrically interconnect the parts, better results are obtained by exposing and mutually contacting the chromate film surfaces at the clamped together seams. Thus, at the seams, and over essentially the entire minimum one inch width of the seams, extremely low resistance chromate-to-chromate interfaces are present.

We claim:

1. An EMI shielded enclosure comprising two oppositely disposed end sections connected together by top and bottom members forming, with said end sections, an enclosure interior space closeable by a side door disposed between said end sections and an end closure member disposed within each of said end sections, each of said end sections including a pair of oppositely disposed corner members, each being formed wholly of seamless sheet metal and being self-supporting for direct contact with a floor surface supporting the enclosure, each pair of oppositely disposed corner members being joined together by oppositely disposed top and bottom horizontal members forming, with first vertical edges of each of said pair of corner members, an end opening into the enclosure closeable by said end closure member, and one of said corner members having a second vertical edge for forming a hinge for said side door.

2. An enclosure according to claim 1 wherein each of said corner members is of generally channel configuration including a pair of oppositely disposed side panels joined together by a base panel, one of said side panels terminating in a gasket flange forming said corner member first vertical edge, and the other of said side panels terminating in a gasket flange forming said corner member second vertical edge, and each of said end section top and horizontal members terminating in a horizontal gasket flange forming, with said gasket flanges of said first vertical edges, an end opening into the enclosure closeable by said end closure member.

3. An enclosure according to claim 2 wherein each of said top and bottom horizontal members joining together the pairs of corner members of one of said end sections is formed wholly of sheet metal including a horizontally extending first panel joined at a right angle to a horizontally extending second panel, said first panels of said horizontal members terminating in said horizontal gasket flanges and including flat surface portions clamped against corresponding flat surface portions of said corner members by fasteners, surfaces of the sheet metal members of said one end section being coated with an electrically conductive film providing a low electrical resistance contacting between said clamped together flat surface portions, other surfaces of said conductive film, except between said clamped together surface portions, being coated with paint whereby the clamped together surface portions are in low resistance contacting relationship.

4. An enclosure according to claim 1 wherein each said top and bottom horizontal members joining together the pair of corner members of each of said sections, and each of said top and bottom members connecting together said two end sections, includes a flat panel terminating at opposite ends with flat flanges bent perpendicular to said flat panel, said flat flanges having a minimum width, measured from said flat panel to a free end of said flange, of one inch, said flanges being clamped against corresponding flat surface portions of said corner members by fastener for forming surface-to-surface seams between each of said members and said corner members, said seams having a width of at least one inch for providing a barrier to EMI radiations.

\* \* \* \* \*